(12) United States Patent
Dutta et al.

(10) Patent No.: US 12,327,770 B2
(45) Date of Patent: Jun. 10, 2025

(54) PROBE PAD WITH BUILT-IN INTERCONNECT STRUCTURE

(71) Applicant: INTERNATIONAL BUSINESS MACHINES CORPORATION, Armonk, NY (US)

(72) Inventors: Ashim Dutta, Clifton Park, NY (US); Ruturaj Nandkumar Pujari, Albany, NY (US); Saumya Sharma, Easton, CT (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 681 days.

(21) Appl. No.: 17/536,228

(22) Filed: Nov. 29, 2021

(65) Prior Publication Data

US 2023/0170266 A1    Jun. 1, 2023

(51) Int. Cl.
| | |
|---|---|
| *H01L 21/66* | (2006.01) |
| *G01B 11/27* | (2006.01) |
| *G01R 1/073* | (2006.01) |
| *H01L 23/544* | (2006.01) |

(52) U.S. Cl.
CPC ............ *H01L 22/32* (2013.01); *G01B 11/272* (2013.01); *G01R 1/073* (2013.01); *H01L 23/544* (2013.01); *H01L 2223/54426* (2013.01)

(58) Field of Classification Search
CPC .. G01B 11/272; G01R 1/073; G01R 31/2884; G01R 1/06755; G01R 31/2639; G01R 31/2644; G01R 1/06761; G01R 31/2831; G01R 1/0408; G01R 31/2891; G01R 31/2867; G01R 1/0491; H01L 23/544; H01L 22/32; H01L 22/14; H01L 27/14689; H01L 27/14643; H01L 27/1463; H01L 27/14683; H01L 21/6835; H01L 21/561; H01L 21/78; H01L 2223/5442;

(Continued)

(56) References Cited

U.S. PATENT DOCUMENTS

| | | | |
|---|---|---|---|
| 5,555,422 A * | 9/1996 | Nakano .............. | G01R 1/07307 324/750.25 |
| 6,429,671 B1 * | 8/2002 | Duckworth ........ | G01R 1/07378 324/750.23 |

(Continued)

OTHER PUBLICATIONS

Liu et al., "Planarity-Tolerant Fine-pitch Reworkable Interconnections with Sharp Protrusions and Microbumps", In2015 IEEE 65th Electronic Components and Technology Conference (ECTC) May 26, 2015 (pp. 1202-1207). IEEE.

(Continued)

*Primary Examiner* — Mouloucoulaye Inoussa
(74) *Attorney, Agent, or Firm* — Tutunjian & Bitetto, P.C.; L. Jeffrey Kelly

(57) ABSTRACT

A system includes a wafer including at least an electronic component and a probe pad including a built-in back-end-of-line (BEOL) interconnect structure to test the electronic component. The electronic component is tested by the probe pad without building full BEOL interconnect circuits on the wafer. The probe pad is aligned with the wafer by using alignment marks. A prober alignment camera is employed to locate the alignment marks.

20 Claims, 6 Drawing Sheets

(58) Field of Classification Search
CPC . H01L 2223/54453; H01L 2223/54426; H01L 2221/68327
See application file for complete search history.

(56) References Cited

U.S. PATENT DOCUMENTS

| | | | |
|---|---|---|---|
| 6,799,976 B1* | 10/2004 | Mok | G01R 3/00 439/55 |
| 7,435,990 B2 | 10/2008 | Keller et al. | |
| 8,703,508 B2* | 4/2014 | Chang | H01L 22/14 257/737 |
| 9,070,586 B1 | 6/2015 | Dang et al. | |
| 9,372,226 B2 | 6/2016 | Uppal et al. | |
| 9,400,309 B2* | 7/2016 | Kiyofuji | G01R 31/2891 |
| 10,001,508 B2 | 6/2018 | Liu et al. | |
| 10,026,661 B2 | 7/2018 | Won et al. | |
| 10,330,701 B2 | 6/2019 | Dang et al. | |
| 10,393,962 B2 | 8/2019 | Barwicz et al. | |
| 10,446,532 B2* | 10/2019 | Uzoh | H01L 25/50 |
| 2003/0099097 A1* | 5/2003 | Mok | G01R 1/07342 361/767 |
| 2004/0080329 A1* | 4/2004 | Jain | G01R 31/2831 324/756.07 |
| 2004/0183556 A1* | 9/2004 | Wada | G01R 1/07314 29/842 |
| 2005/0275418 A1* | 12/2005 | Chong | G01R 1/073 324/750.25 |
| 2006/0006889 A1* | 1/2006 | Smith | G01R 1/0735 324/754.07 |
| 2006/0091322 A1* | 5/2006 | Despont | G03F 7/0002 977/863 |
| 2006/0132155 A1* | 6/2006 | Yamada | G01R 31/2891 324/750.25 |
| 2006/0186906 A1* | 8/2006 | Bottoms | G01R 1/07378 324/755.05 |
| 2006/0240690 A9* | 10/2006 | Mok | G01R 1/07342 439/81 |
| 2007/0046304 A1* | 3/2007 | Mok | G01R 3/00 324/750.05 |
| 2007/0232090 A1* | 10/2007 | Colgan | H01L 23/49838 257/E23.068 |
| 2008/0061808 A1* | 3/2008 | Mok | G01R 1/07357 427/98.6 |
| 2008/0096295 A1* | 4/2008 | Hasebe | H01L 22/34 257/E21.531 |
| 2008/0196474 A1* | 8/2008 | Di Stefano | G01M 1/12 73/1.01 |
| 2008/0246500 A1* | 10/2008 | Chong | G01R 1/073 324/755.05 |
| 2010/0045322 A1* | 2/2010 | Di Stefano | G01R 31/2891 324/756.03 |
| 2010/0219852 A1* | 9/2010 | Yamada | G01R 1/07371 324/756.03 |
| 2010/0253374 A1* | 10/2010 | Chen | G01R 31/31905 324/755.01 |
| 2011/0027917 A1* | 2/2011 | Shinkawata | H01L 27/0203 257/E21.531 |
| 2011/0055982 A1* | 3/2011 | Watanabe | G01Q 10/04 850/2 |
| 2011/0121847 A1* | 5/2011 | Umemura | G01R 1/0735 324/754.11 |
| 2011/0156734 A1* | 6/2011 | Berry | G01R 31/2891 324/750.19 |
| 2011/0234247 A1* | 9/2011 | Ishii | G01R 31/2891 324/750.16 |
| 2012/0286817 A1* | 11/2012 | Duckworth | G01R 1/06711 324/755.01 |
| 2013/0249085 A1* | 9/2013 | Ide | H01L 25/0657 257/737 |
| 2014/0015558 A1* | 1/2014 | Akahori | G01R 1/067 324/755.01 |
| 2014/0051189 A1* | 2/2014 | Kai-Jun | H01L 22/14 257/E21.531 |
| 2014/0266281 A1* | 9/2014 | Wang | G01R 1/0483 324/756.02 |
| 2015/0037914 A1* | 2/2015 | Takahashi | H01L 22/14 438/15 |
| 2015/0061718 A1* | 3/2015 | Chan | G01R 31/2886 324/756.03 |
| 2017/0200657 A1* | 7/2017 | Ho | H01L 21/6835 |
| 2017/0261544 A1* | 9/2017 | Amponsah | G01R 1/06755 |
| 2017/0363681 A1* | 12/2017 | Salmon | G01R 1/07378 |
| 2018/0143244 A1* | 5/2018 | Chuang | G01R 31/2891 |
| 2019/0103327 A1 | 4/2019 | Horibe et al. | |
| 2019/0302185 A1* | 10/2019 | Maggioni | G01R 1/07392 |
| 2020/0326370 A1* | 10/2020 | Wang | G01R 1/06722 |
| 2021/0215738 A1* | 7/2021 | Torreiter | G01R 31/2831 |
| 2021/0311094 A1* | 10/2021 | Endo | G01R 31/2891 |
| 2022/0034959 A1* | 2/2022 | Arai | G01R 31/308 |
| 2022/0236303 A1* | 7/2022 | Schindler | G01R 1/073 |
| 2023/0014966 A1* | 1/2023 | Snow | H01L 21/6719 |
| 2023/0072615 A1* | 3/2023 | Ikesu | G01R 31/2656 |
| 2024/0096675 A1* | 3/2024 | Tatsumi | G01R 31/26 |
| 2024/0110974 A1* | 4/2024 | Tomita | G01R 1/073 |
| 2024/0280610 A1* | 8/2024 | Shimizu | G01R 1/06 |

OTHER PUBLICATIONS

Wright et al., "Transferable-Tip Technology for Fine-Pitch Probes and Interconnections", IEEE Transactions On Components, Packaging and Manufacturing Technology, vol. 9, No. 8, Aug. 2019, pp. 1451-1458.

* cited by examiner

PROBE PAD WITH BUILT-IN INTERCONNECT STRUCTURE

BACKGROUND

The present invention relates generally to semiconductor manufacturing and testing, and more specifically, to a probe pad with a built-in interconnect structure.

Generally, an interconnect structure incorporated into an integrated circuit (IC) includes one or more levels of metal lines to connect the electronic devices of the IC to one another and to external connections. An interlayer dielectric (ILD) is placed between the metal levels of the IC for insulation. Usually an additive patterning technique, known as a damascene process, is used to fabricate a copper interconnect. In this process, the underlying silicon oxide insulating layer is patterned to form trenches. The trenches in the insulating layer are filled with a thick layer of copper, and chemical-mechanical polishing (CMP) is used to remove the copper that extends above the top of the insulating layer. Copper within the trenches of the insulating layer is not removed and becomes the patterned conductor. Moreover, in a dual damascene (DD) process, two features of copper interconnect are formed at once, that is, a trench overlying a via, may both be filled with a single copper deposition. In most cases, the DD interconnects need a liner for adhesion and a hermetic barrier to protect the metal.

SUMMARY

In accordance with an embodiment, a system is provided. The system includes a wafer including at least an electronic component and a probe pad including a built-in back-end-of-line (BEOL) interconnect structure to test the electronic component.

In accordance with another embodiment, a method is provided. The method includes handling a wafer having at least an electronic component and testing the electronic component by using a probe pad including a built-in back-end-of-line (BEOL) interconnect structure.

In accordance with yet another embodiment, a system is provided. The system includes a wafer including at least an electronic component, a probe pad including a built-in back-end-of-line (BEOL) interconnect structure to test the electronic component, and an alignment circuit to align probe pad alignment marks with wafer alignment marks by employing a prober alignment camera.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
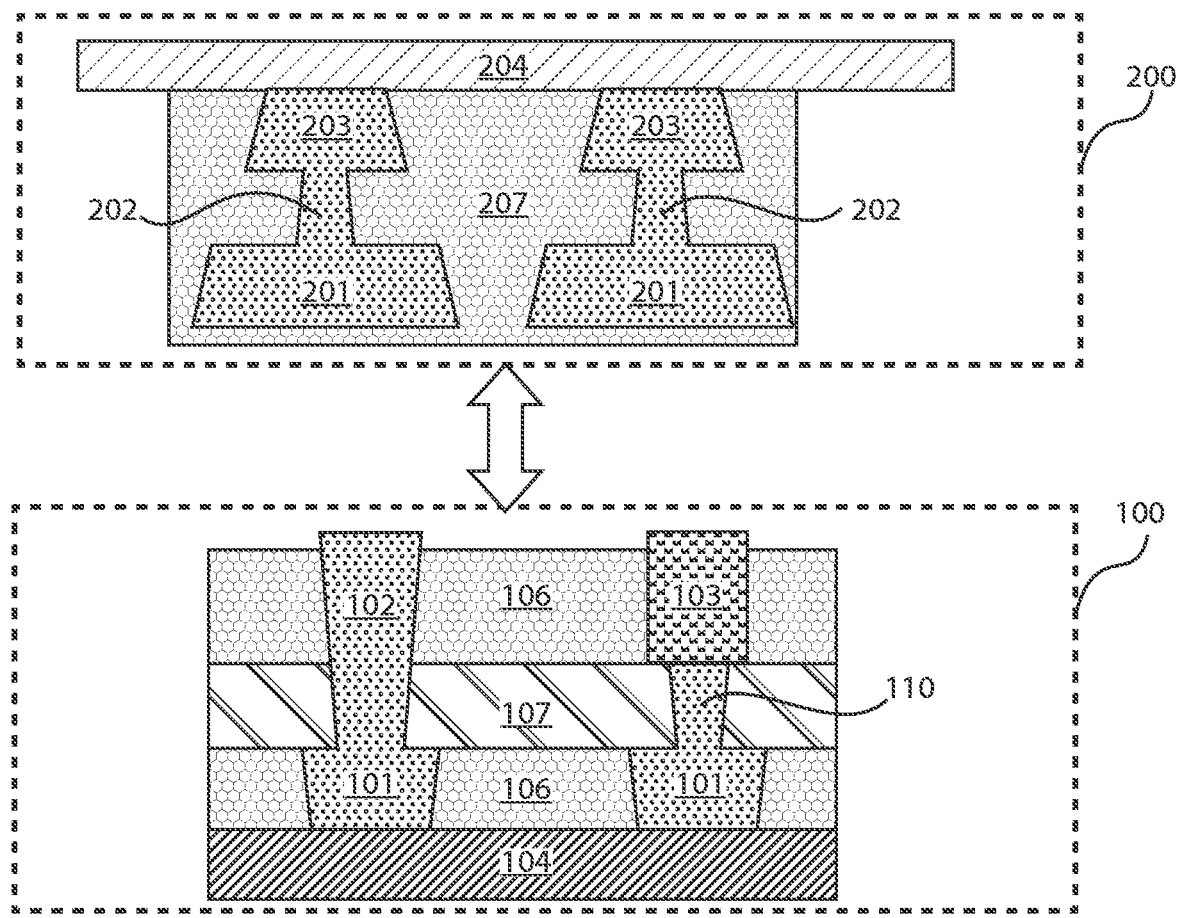
FIG. 1 is a cross-sectional view of a probe pad with built-in back-end-of-line (BEOL) interconnect structures, in accordance with an embodiment of the present invention.

Embodiments in accordance with the present invention provide for a probe pad with built-in back-end-of-line (BEOL) interconnect structures for wafer level testing without building complex BEOL interconnect layers on the wafer. The probe pad is used for process verification and allows testing semiconductor memory or logic devices at the wafer level without the need for building complex BEOL interconnect layers.

Semiconductor manufacturing requires a large number of processing steps to form BEOL interconnect structures before the semiconductor device (memory or logic) is testable using conventional probe pads. This increases the time and cost of developing and testing new semiconductor devices for future technology nodes.

Semiconductor integrated circuit (IC) chips have layers stacked such that layer features overlay one another to form individual devices and connect devices together. ICs are mass produced by forming an array of chips on a thin semiconductor wafer. Each array location is known as a die. A wafer may be as large as a dinner plate or larger, e.g., 12 inches (300 millimeters or 300 mm), with projections for 18 inch (450 mm) wafers in the near future. Larger wafers allow for more die per wafer for a given die size. At the same time, increased logic complexity requires a higher input/output (I/O) count.

Each die may harbor a multilayered structure, such as an IC chip or a structure for test or alignment. The surface layer of each completed chip or die is typically populated by probe-able off-chip pads for connecting to chip power and input/output (I/O) signals. Packing more function on each die usually means providing more and more I/O signals for each die, on one (a top) surface, or for a three dimensional (3D) chip structure, both (top and bottom) surfaces. Each die has at least one surface pad for each I/O signal and a number of power (supply and ground) connection pads. Increasing I/O signal and supply pad count for a given die size requires a tighter I/O pad pitch for dense I/O pad arrays, and correspondingly, a tighter test probe pitch. An IC wafer, for example, die may be populated by several thousand connection pads on very tight a pitch less than 50 microns (<50 µm).

Testing these tightly packed pads with or without solder balls requires very fine, delicate, tightly-packed test probes. Historically, what are known as cobra probes were used to probe down to 150 µm. Probing tightly-packed pads at 50 µm and below requires very precise probe tip geometry control and scalability. Achieving necessary probe tip precision for probing ultra-fine pitch pads has proven very difficult, and therefore, expensive. Moreover, in addition to increasing test time, repetitively shifting from one die to the next during manufacturing test, tends to degrade probe quality for these very fine, delicate, tightly-packed test probes.

Previously, multisite testing was unavailable for wafers populated by logic complex chips. Large probe heads, especially wafer level probe heads, could be used for testing low pin count memory chips, where it may be relatively easy to make contact to multiple memory dies simultaneously. However, these large probe head test cards were very expensive to build and to maintain. Moreover, these large probe heads have been limited to low pin count applications, which made the probes unattractive for high input/output (I/O) count logic chips. The poor precision of these traditional probes has made high pin count probe heads unsuitable, especially when considering the level of probe force that may be required to contact all of chip pads for chips under test. Thus, there is a need for low cost multi-chip test probes.

Embodiments in accordance with the present invention alleviate such complications by providing a method and structure for a probe pad with built-in BEOL interconnect structures. This allows testing of semiconductor memory or logic devices at the wafer level without building complex BEOL interconnect layers. The probe pad can be wafer sized to test all the chips in the wafer simultaneously (or concurrently) or the probe pad can be of smaller size to test single or multiple dies at a time.

Examples of semiconductor materials that can be used in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a probe pad with built-in back-end-of-line (BEOL) interconnect structures, in accordance with an embodiment of the present invention.

In general, a multi-chip probe head has application to simultaneously testing multiple electronics chips, such as the Internet of Things (IoT) device and wearable device chips, manufactured on ultra-thin wafers. These thin wafers are characterized by large quantities (hundreds to thousands or more) of dies with small, tightly packed signal and power supply pads. Thus, for such a wafer, even a single quadrant may include hundreds, thousands or more chip pads, e.g., 700,000 pads, for functional test. A test probe assembly has equally tightly packed probes with high co-planarity such that all the probes contact all test points for all of the multiple devices under test (DUTs) even with low probe force. Thus, the multi-chip test probe structure (e.g., probes, probe head and connecting interposer(s)) lends itself to high pin count applications, up to and including, for full wafer level functional testing.

Referring to FIG. 1, probe pad 200 advantageously includes a built-in BEOL structure. The built-in BEOL structure includes BEOL metal lines 201, BEOL metal contacts 202, and BEOL metal lines 203 all formed within a dielectric 207. The probe pad 200 includes a probe pad section 204. Thus, the probe pad section 204 connects to the built-in BEOL structure. The BEOL metal lines 201 and the BEOL metal contacts 202 connect to the probe pad testing circuits.

The wafer 100 includes a substrate 104. Conductive lines 101 are formed over the substrate 104. A dielectric 106 is deposited over the conductive lines 101. A metal contact 110 is formed over one of the conductive lines 101. A dielectric 107 is then deposited.

A memory stack or metal stack or electronic component 103 is formed over and in direct contact with the metal contact 110. A metal contact 102 is also formed to another conductive line 101. Further dielectric 106 is deposited.

The electronic component 103 can be tested without building full BEOL interconnect circuits on the wafer 100. The BEOL interconnect circuits will instead be part of the probe pad 200. Alignment of the probe pad 200 with the wafer 100 will be performed by using alignment marks as detailed below with reference to FIGS. 3 and 4.

In one example, the wafer 100 may be or include any silicon-containing substrate material including, but not limited to, single crystal Si, polycrystalline Si, amorphous Si, Si-on-nothing (SON), Si-on-insulator (SOI), or Si-on-replacement insulator (SRI) substrates. In other examples, the wafer 100 may be or include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb) or combinations thereof or an alloy semiconductor including GaAsP, AlInAs, GaInAs, GaInP, or GaInAsP or combinations thereof.

The substrate 104 can be crystalline, semi-crystalline, microcrystalline, or amorphous. The substrate 104 can be essentially (e.g., except for contaminants) a single element (e.g., silicon), primarily (e.g., with doping) of a single element, for example, silicon (Si) or germanium (Ge), or the substrate 104 can include a compound, for example, GaAs, SiC, or SiGe. The substrate 104 can also have multiple material layers. In some embodiments, the substrate 104 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 104. In some embodiments, the substrate 104 includes both semiconductor materials and dielectric materials. The semiconductor substrate 104 can also include an organic semiconductor or a layered semiconductor such as, for example, Si/SiGe, a silicon-on-insulator or a SiGe-on-insulator. A portion or entire semiconductor substrate 104 can be amorphous, polycrystalline, or monocrystalline.

The conductive lines 101, 102, 201, 203 can be, e.g., formed from Ta, Ti/TiN, W, WN, TaN, polysilicon, doped polysilicon, amorphous silicon, doped amorphous silicon, or any other suitable material, or any other conductive material. Alternatively, the conductive lines 101, 102, 201, 203 can be, e.g., any suitable conductive material or materials, e.g., Ag, Al, Cu, TaN, Ti, TiN, Al or any other suitable material, and can be deposited or formed in any suitable manner.

In another embodiment, the conductive lines 101, 102, 201, 203 are e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof.

The conductive lines 101, 102, 201, 203 are deposited using one of deposition techniques, such as but not limited to a CVD, PVD, MBE, MOCVD, ALD, spin-on, electro-less, electro-plating, or other deposition techniques known to one of ordinary skill in the art of microelectronic device manufacturing.

Moreover, non-limiting examples of suitable conductive materials for the conductive lines 101, 102, 201, 203 include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials.

The dielectric 106, 207 can include, but are not limited to, SiN, SiOCN, SiOC, SiBCN, $SO_2$, or ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 10.

In one embodiment, dielectric 106, 207 are a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride, or any combination thereof. In one embodiment, the dielectric 106, 207 include a dielectric material having k-value less than 5. In one embodiment, the dielectric 106, 207 include a dielectric material having k-value less than 2. In alternative embodiments, the dielectric 106, 207 include a nitride, oxide, a polymer, phosphosilicate glass, fluorosilicate (SiOF) glass, organosilicate glass (SiOCH), other electrically insulating layer determined by an electronic device design, or any combination thereof.

In some embodiments, the dielectric 106, 207 can be conformally deposited using ALD or CVD. Variations of CVD processes suitable for forming the dielectric 106, 207 include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

Figure 2:
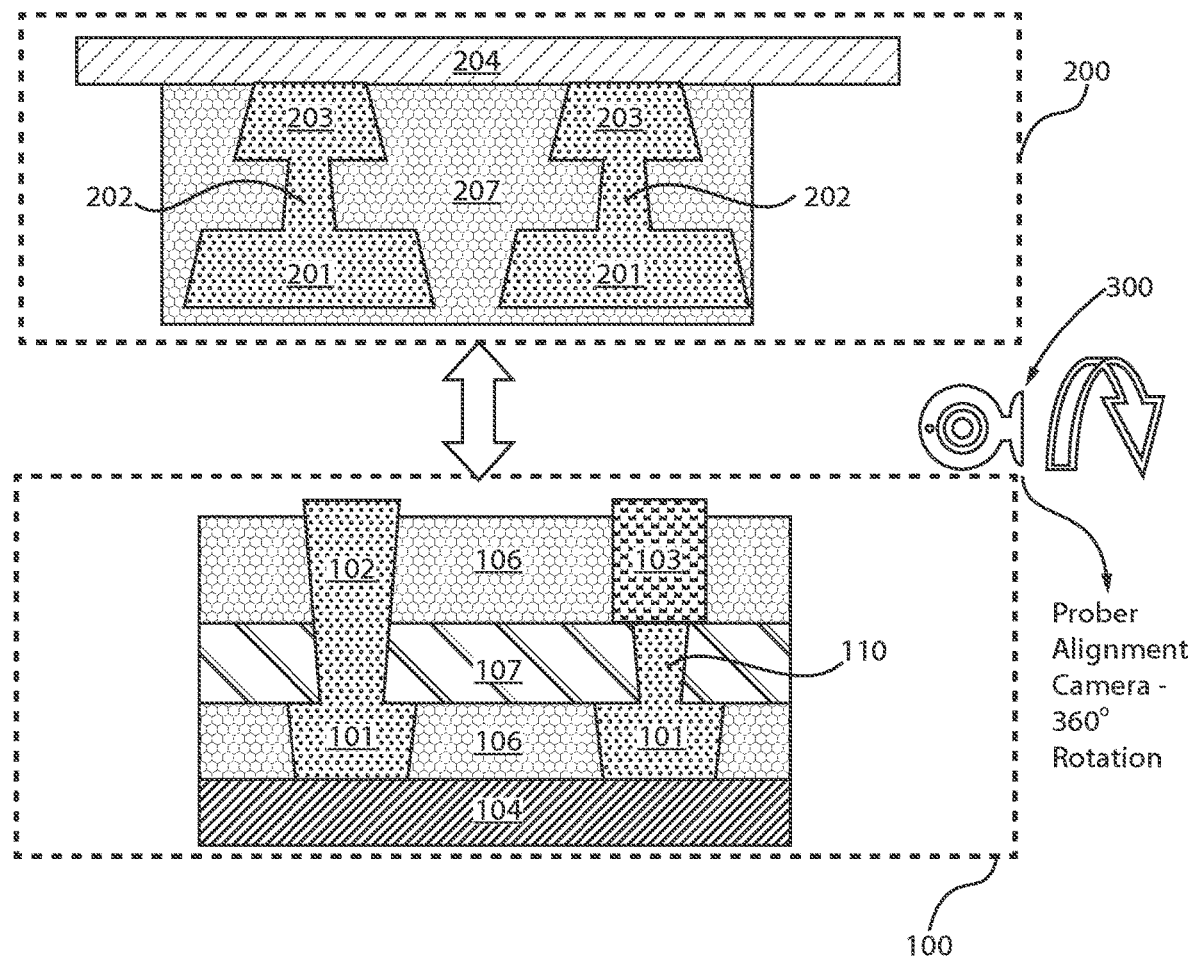
FIG. 2 illustrates the probe pad of FIG. 1 with a prober alignment camera attached thereto, in accordance with an embodiment of the present invention.

FIG. 2 illustrates the probe pad of FIG. 1 with a prober alignment camera attached thereto, in accordance with an embodiment of the present invention.

In various example embodiments, a prober alignment camera 300 is attached. The prober alignment camera 300 has 360° rotation. The prober alignment camera 300 looks over the wafer 100 and the probe head of the probe pad 200 for distinctive alignment marks. The wafer 100 includes wafer alignment marks and the probe pad 200 includes probe pad alignment marks as detailed below with reference to FIG. 3.

Figure 3:
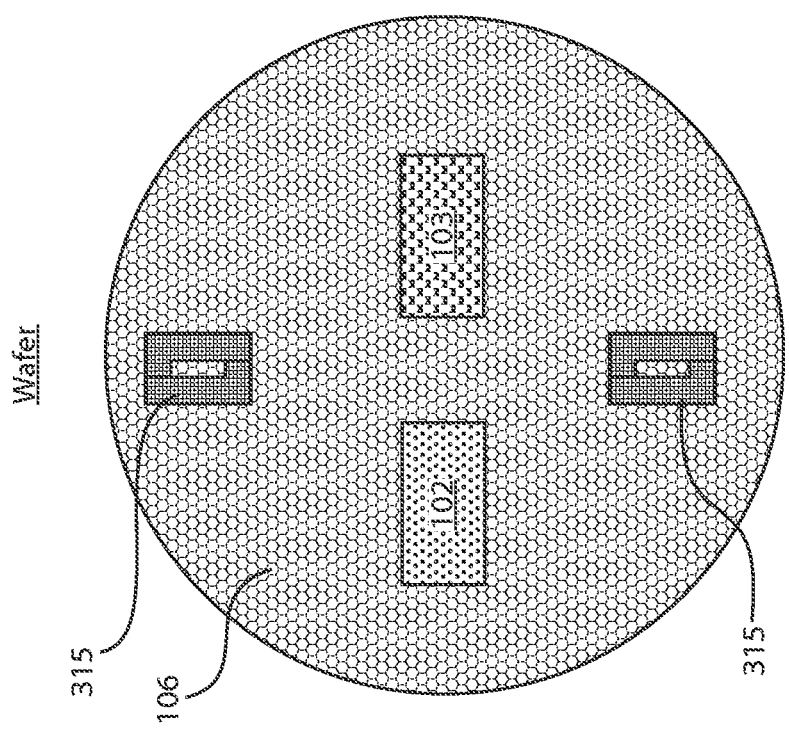
FIG. 3 is a top view of the probe pad and the wafer illustrating the alignment marks, in accordance with an embodiment of the present invention.
Figure 3:
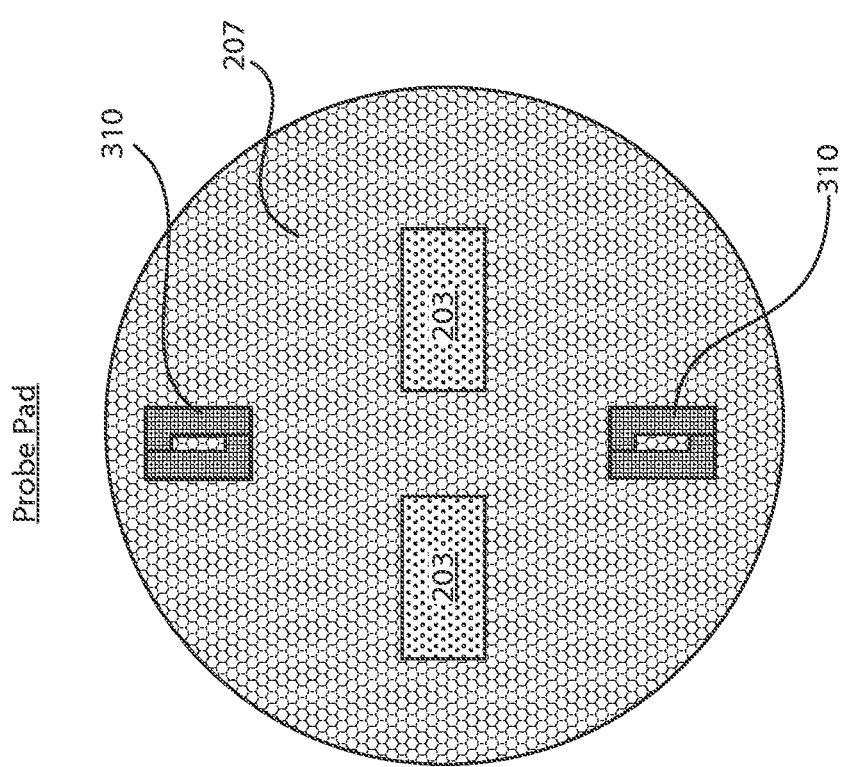

FIG. 3 is a top view of the probe pad and the wafer illustrating the alignment marks, in accordance with an embodiment of the present invention.

In various example embodiments, a top view of the probe pad 200 is illustrated. Probe pad alignment marks 310 are positioned on opposed ends of the probe pad 200. One skilled in the art can contemplate a plurality of probe pad alignment marks 310 on different locations on the probe pad 200 and in different geometric configurations. In one example, the probe pad alignment marks 310 are generally rectangular in nature.

The top view of the wafer 100 illustrates wafer alignment marks 315. Wafer alignment marks 315 are positioned on opposed ends of the wafer 100. One skilled in the art can contemplate a plurality of wafer alignment marks 315 on different locations on the wafer 100 and in different geometric configurations. In one example, the wafer alignment marks 315 are generally rectangular in nature.

Alignment marks 310, 315 are strategically patterned on the probe pad 200 and the wafer 100 so that the prober alignment camera 300 (FIG. 2) can use pattern recognition to align the probe head of the probe pad 200 and the wafer 100 by detecting such patterns throughout so that the probes can land on the desired structures.

Alignment marks 310, 315 may have any pattern, as long as they can be identified. In other exemplary embodiments, alignment marks 310, 315 can have a top view of a cross, which includes two strip openings crossing each other. In further exemplary embodiments, an alignment mark can include a plurality of discrete openings that are aligned to form a distinguishable layout such as a cross, a straight line, a triangle, a rectangle, or the like. Alignment marks 310, 315 may be formed using a laser to cut into wafer 100 or the probe pad 200. Alternatively, alignment marks 310, 315 may be formed using a blade, a metal drill, or the like. Alignment marks 310, 315 extend into wafer 100 in a direction perpendicular to the top surface of wafer 100, so that when wafer alignment marks 315 are exposed from the back side of wafer 100, they are in the same location relative to chips.

Moreover, the wafer alignment marks 315 may include any variety of marks such as dots or strips of uniform or varying size referenced to one or more of the dicing channels on the wafer 100. The wafer alignment marks 315 may be any geometric feature such as circles or squares or any other suitable shape. The wafer alignment mark 315 may also be a notch or any mark which can be used as a reference point. The wafer alignment marks 315 can be placed in fixed relation to the dicing channels on the wafer 100.

Figure 4:
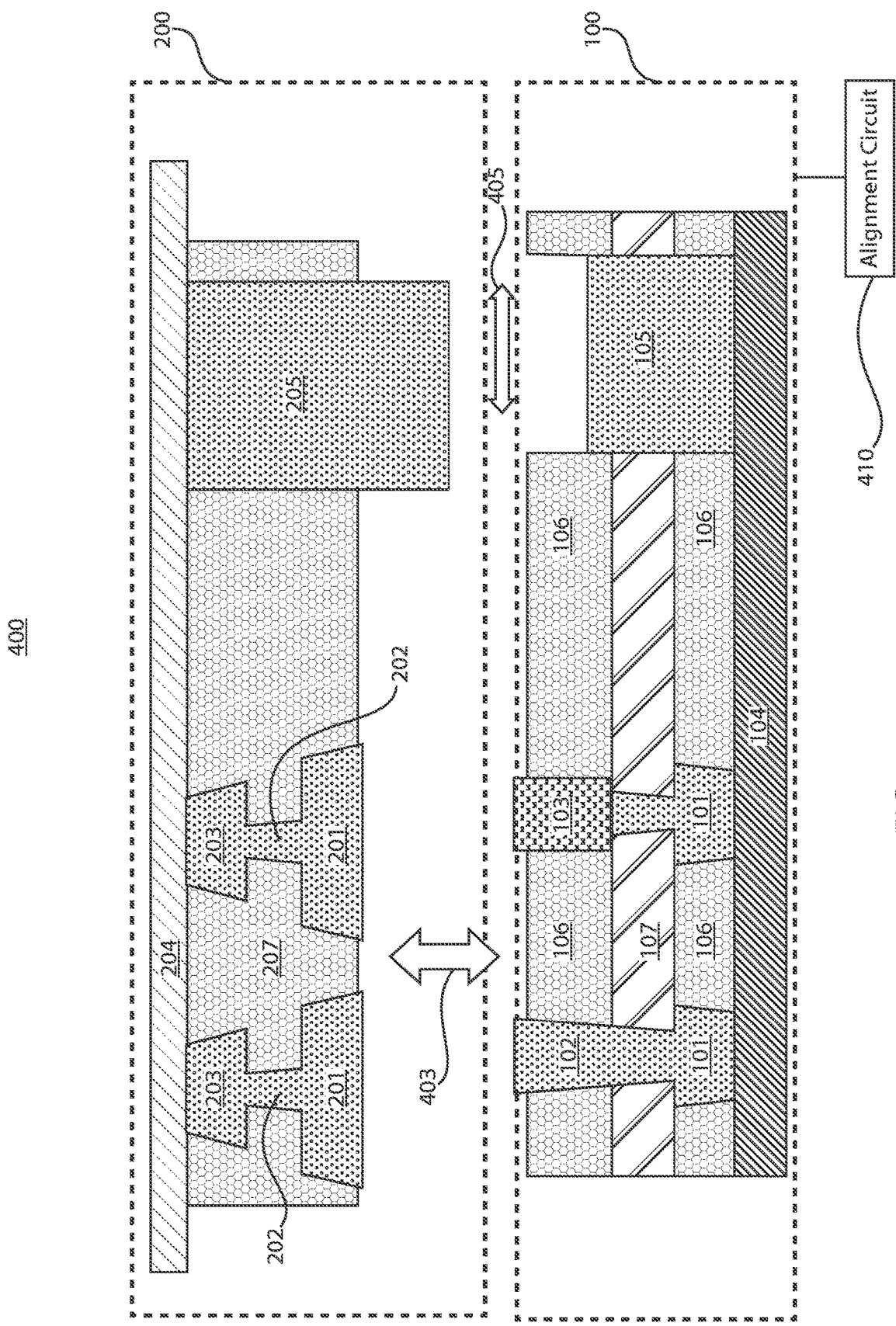
FIG. 4 illustrates an alignment circuit for enabling alignment between the wafer and the probe pad, in accordance with an embodiment of the present invention.

FIG. 4 illustrates an alignment circuit for enabling alignment between the wafer and the probe pad, in accordance with an embodiment of the present invention.

In various example embodiments, the system 400 illustrates an alignment circuit 410 connected to the wafer 100. The alignment circuit 410 aids in aligning the wafer 100 with the probe pad 200. For example, a horizontal alignment 405 can occur to align the conductive line 105 of wafer 100 with the conductive line 205 of the probe pad 200. Additionally, a vertical alignment 403 can also occur between elements and/or components of the wafer 100 and the probe pad 200. The alignment circuit 410 shows a low resistance when it connects to the counterpart circuit on the wafer 100.

Therefore, according to FIGS. 1-4, a method and structure of a probe pad is presented where BEOL interconnect structures for testing a device of interest (e.g., memory device or logic devices or metal layer or interconnect, or electronic components, etc.) is not a part of the wafer 100, but instead is part of the probe pad 200. The probe pad 200 has different BEOL interconnect circuits for different designs of devices or electronic components to be tested. The probe pad 200 can be wafer sized to test all the chips in the wafer 100 simultaneously or the probe pad 200 can be of smaller size to test a single or multiple dies at a time. The probe pad 200 with BEOL interconnect structures has probe pad alignment marks 310 which are aligned with the wafer alignment marks 315. Probe pad alignment marks 310 on the probe pad 200 are connected to an alignment circuit 410, which will show low resistance when it aligns to the counterpart circuit on wafer 100.

Figure 5:
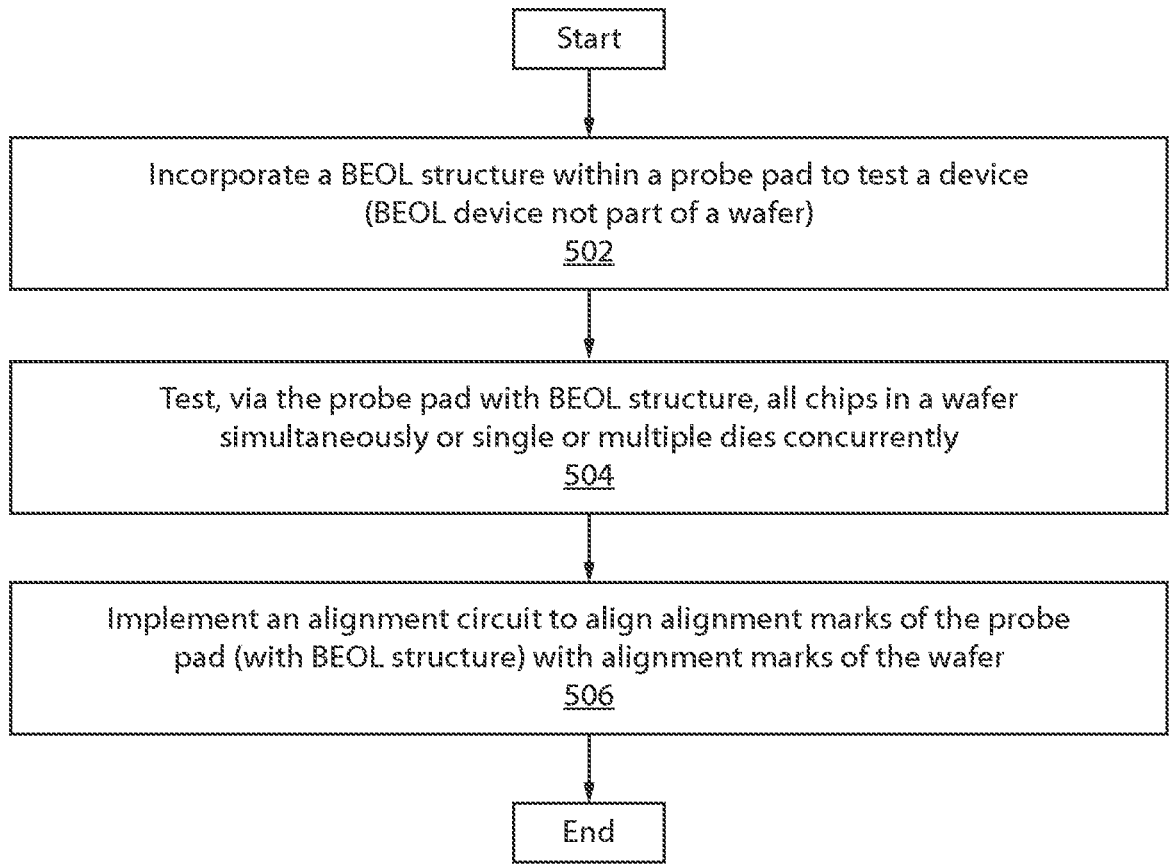
FIG. 5 is a block/flow diagram of a method for implementing the alignment circuit of FIG. 4, in accordance with an embodiment of the present invention.

FIG. 5 is a block/flow diagram of a method for implementing the alignment circuit of FIG. 4, in accordance with an embodiment of the present invention.

At block 502, incorporate a BEOL structure within a probe pad to test a device (BEOL device not part of a wafer).

At block 504, test, via the probe pad with BEOL structure, all chips in a wafer simultaneously or single or multiple dies concurrently.

At block 506, implement an alignment circuit to align alignment marks of the probe pad (with BEOL structure) with alignment marks of the wafer.

The fabrication processing disclosed herein may include numerous steps in which materials may be introduced onto or within the wafer 100, using for example, chemical vapor deposition, atomic layer deposition, epitaxial growth, oxidation treatment, etc. For instance, the wafer 100 may be patterned and etched, and the wafer 100 may be exposed to various processing treatments, such as photolithographic patterning, isotropic or anisotropic etching, plasma treatment, annealing (including spike annealing), etc. Fabrication processing may include front-end of line (FEOL) processing, in which individual devices are created, including, for example, metal-oxide-semiconductor field-effect transistors (MOSFETs), as well as capacitors, resistors, and other semiconductor devices. Such devices may be planar, or may be three dimensional, for example including a fin structure extending from the semiconductor substrate upon which the channel, source, and/or drain may be formed. These devices may be formed using various techniques, and their formation may include several steps of processing such as depositing or growing materials to create surface structures, isolating devices with shallow or deep trenches that are filled with isolation materials, forming n-type and p-type wells by doping one or more portions, providing gate structures, establishing source and drain structures, etc.

Figure 6:
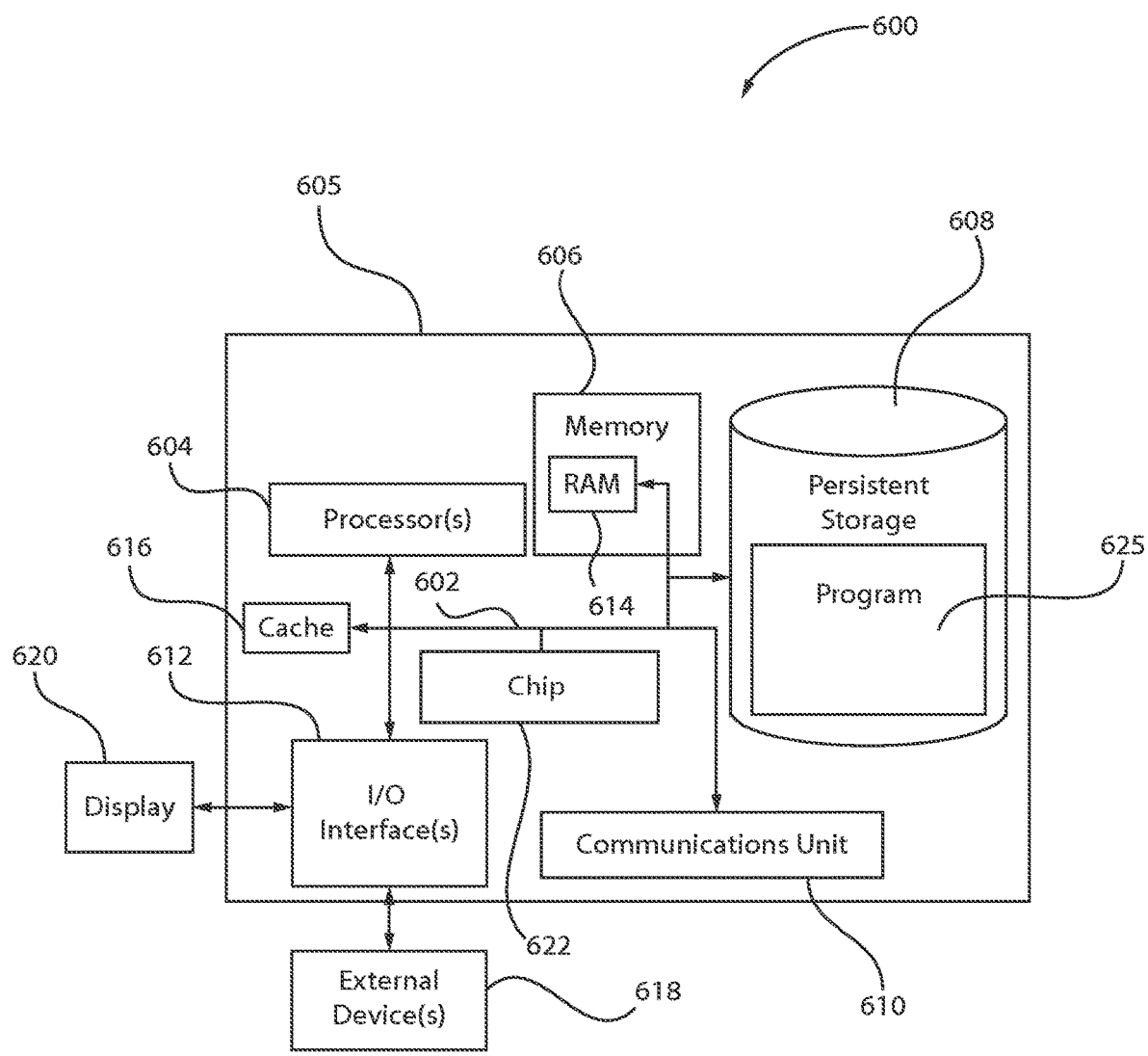
FIG. 6 is a block/flow diagram of an exemplary processing system for employing the alignment circuit, in accordance with an embodiment of the present invention.

FIG. 6 is a block/flow diagram of an exemplary processing system for employing the alignment circuit, in accordance with an embodiment of the present invention.

FIG. 6 depicts a block diagram of components of system 600, which includes computing device 605. It should be appreciated that FIG. 6 provides only an illustration of one implementation and does not imply any limitations with regard to the environments in which different embodiments can be implemented. Many modifications to the depicted environment can be made.

Computing device 605 includes communications fabric 602, which provides communications between computer processor(s) 604, memory 606, persistent storage 608, communications unit 610, and input/output (I/O) interface(s) 612. Communications fabric 602 can be implemented with any architecture designed for passing data and/or control information between processors (such as microprocessors, communications and network processors, etc.), system memory, peripheral devices, and any other hardware components within a system. For example, communications fabric 602 can be implemented with one or more buses.

Memory 606, cache memory 616, and persistent storage 608 are computer readable storage media. In this embodiment, memory 606 includes random access memory (RAM) 614. In another embodiment, the memory 606 can be flash memory. In general, memory 606 can include any suitable volatile or non-volatile computer readable storage media.

In some embodiments of the present invention, program 625 is included and operated by chip 622 as a component of computing device 605. In other embodiments, program 625 is stored in persistent storage 608 for execution by chip 622 (to implement the alignment circuit) in conjunction with one or more of the respective computer processors 604 via one or more memories of memory 606. In this embodiment, persistent storage 608 includes a magnetic hard disk drive. Alternatively, or in addition to a magnetic hard disk drive, persistent storage 608 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 608 can also be removable. For example, a removable hard drive can be used for persistent storage 608. Other examples include optical and magnetic disks, thumb drives, and smart cards that are inserted into a drive for transfer onto another computer readable storage medium that is also part of persistent storage 608.

Communications unit 610, in these examples, provides for communications with other data processing systems or devices, including resources of distributed data processing environment. In these examples, communications unit 610 includes one or more network interface cards. Communications unit 610 can provide communications through the use of either or both physical and wireless communications links. Program 625 can be downloaded to persistent storage 608 through communications unit 610.

I/O interface(s) 612 allows for input and output of data with other devices that can be connected to computing system 600. For example, I/O interface 612 can provide a connection to external devices 618 such as a keyboard, keypad, a touch screen, and/or some other suitable input device. External devices 618 can also include portable computer readable storage media such as, for example, thumb drives, portable optical or magnetic disks, and memory cards.

Display 620 provides a mechanism to display data to a user and can be, for example, a computer monitor.

In summary, the exemplary embodiments of the present invention provide for a probe pad with built-in BEOL interconnect structures for wafer level testing without building complex BEOL interconnect layers on the wafer. The probe pad is used for process verification and allows testing semiconductor memory or logic devices at the wafer level without the need for building complex BEOL interconnect layers. The probe pad has different BEOL interconnect circuits for different designs of devices or electronic components to be tested. The probe pad can be wafer sized to test all the chips in the wafer simultaneously or the probe pad can be of smaller size to test a single or multiple dies at a time. The probe pad with BEOL interconnect structures has probe pad alignment marks which are aligned with the wafer alignment marks. Alignment marks on the probe pad are connected to an alignment circuit, which will show low resistance when it aligns to the counterpart circuit on wafer.

Regarding FIGS. 1-4, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}$ $(\Omega\text{-m})^{-1}$.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

It is to be understood that the present invention will be described in terms of a given illustrative architecture.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B)

only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a probe pad with built-in interconnect structure (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A system comprising:
    a wafer including at least an electronic component; and
    a probe pad including a built-in back-end-of-line (BEOL) interconnect structure to test the electronic component, the probe pad being aligned with the wafer by using a prober alignment camera between the probe pad and the wafer to locate alignment marks.

2. The system of claim 1, wherein the electronic component is tested by the probe pad without building full BEOL interconnect circuits on the wafer.

3. The system of claim 1, wherein the BEOL interconnect structure of the probe pad includes conductive lines and metals contacts formed within a dielectric.

4. The system of claim 1, wherein the probe pad alignment marks are positioned on opposed ends on the probe pad.

5. The system of claim 4, wherein the probe pad alignment marks are connected to an alignment circuit.

6. The system of claim 1, wherein different BEOL interconnect structures can be incorporated into the probe pad to test different types of electronic components.

7. The system of claim 1, wherein the probe pad is wafer-sized to test all chips in the wafer simultaneously.

8. The system of claim 1, wherein the probe pad is smaller than the wafer to test a single die or multiple dies at a time.

9. The system of claim 1, wherein the electronic component is a memory device.

10. The system of claim 1, wherein the electronic component is a logic device.

11. A method comprising:
    handling a wafer having at least an electronic component;
    using a prober alignment camera between a probe pad and the wafer to locate alignment marks; and
    testing the electronic component by using the probe pad including a built-in back-end-of-line (BEOL) interconnect structure.

12. The method of claim 11, wherein the electronic component is tested by the probe pad without building full BEOL interconnect circuits on the wafer.

13. The method of claim 11, wherein the probe pad is aligned with the wafer by using alignment marks.

14. The method of claim 11, wherein probe pad alignment marks are positioned on opposed ends on the probe pad, the probe pad alignment marks connected to an alignment circuit.

15. The method of claim 11, wherein the probe pad is wafer-sized to test all chips in the wafer simultaneously.

16. A system comprising:
    a wafer including at least an electronic component;
    a probe pad including a built-in back-end-of-line (BEOL) interconnect structure to test the electronic component;
    a prober alignment camera to align prober alignment marks with wafer alignment marks; and
    an alignment circuit to align the probe pad with the wafer, the alignment circuit having low resistance when the prober and the wafer are aligned.

17. The system of claim 16, wherein the probe pad is wafer-sized to test all chips in the wafer simultaneously.

18. The system of claim 1, wherein the camera can rotate 360°.

19. The method of claim 11, wherein the camera can rotate 360°.

20. The system of claim 16, wherein the camera can rotate 360°.

* * * * *